(12) United States Patent
Miyamura et al.

(10) Patent No.: US 10,748,614 B2
(45) Date of Patent: Aug. 18, 2020

(54) SEMICONDUCTOR DEVICE AND PROGRAMMING METHOD THEREFOR

(71) Applicant: NEC Corporation, Tokyo (JP)

(72) Inventors: Makoto Miyamura, Tokyo (JP); Ryusuke Nebashi, Tokyo (JP); Toshitsugu Sakamoto, Tokyo (JP); Yukihide Tsuji, Tokyo (JP); Xu Bai, Tokyo (JP); Ayuka Tada, Tokyo (JP)

(73) Assignee: NEC CORPORATION, Minato-ku, Tokyo (JP)

( * ) Notice: Subject to any disclaimer, the term of this patent is extended or adjusted under 35 U.S.C. 154(b) by 0 days.

(21) Appl. No.: 16/324,782

(22) PCT Filed: Sep. 11, 2017

(86) PCT No.: PCT/JP2017/032606
§ 371 (c)(1),
(2) Date: Feb. 11, 2019

(87) PCT Pub. No.: WO2018/051931
PCT Pub. Date: Mar. 22, 2018

(65) Prior Publication Data
US 2019/0180818 A1    Jun. 13, 2019

(30) Foreign Application Priority Data

Sep. 13, 2016  (JP) ................................ 2016-178734

(51) Int. Cl.
*G11C 13/00* (2006.01)
*H03K 19/17736* (2020.01)

(52) U.S. Cl.
CPC .......... *G11C 13/0069* (2013.01); *G11C 13/00* (2013.01); *G11C 13/003* (2013.01);
(Continued)

(58) Field of Classification Search
CPC ............ G11C 13/0069; G11C 13/0002; G11C 13/004; G11C 13/0007; G11C 13/0026;
(Continued)

(56) References Cited

U.S. PATENT DOCUMENTS

2013/0051134 A1 * 2/2013 Kawahara ............. H01L 27/228
365/158

FOREIGN PATENT DOCUMENTS

JP    11-087713 A    3/1999
JP    2005-101535 A    4/2005
(Continued)

OTHER PUBLICATIONS

International Search Report of PCT/JP2017/032606 dated Oct. 17, 2017 [PCT/ISA/210].

*Primary Examiner* — Thong Q Le
(74) *Attorney, Agent, or Firm* — Sughrue Mion, PLLC

(57) ABSTRACT

In order to provide a highly reliable crossbar circuit that enables salvation of reversal of a resistive state of a variable resistance element, the semiconductor device has a configuration obtained by parallelly arranging two unit elements, each including variable-resistance two-terminal elements connected in series, the semiconductor device being provided with: a unit element group being connected to a first wiring and a second wiring; a first programming driver that changes, via the first wiring, a resistive state of the two-terminal element constituting the unit element group; a first selection transistor being connected to the first wiring and the first programming driver; a second programming driver that changes, via the second wiring, a resistive state of the two-terminal element constituting the unit element group; and a second selection transistor being connected to the second wiring and the second programming driver.

10 Claims, 16 Drawing Sheets

(52) U.S. Cl.
CPC ... *G11C 13/0023* (2013.01); *H03K 19/17736* (2013.01); *G11C 2213/79* (2013.01)

(58) Field of Classification Search
CPC . G11C 2213/79; G11C 13/0028; G11C 16/10; G11C 16/0483; G11C 16/26; G11C 11/1659
USPC .... 365/148, 185.2, 51, 158, 185.23, 185.29, 365/189.011, 104, 163, 171, 175, 185.03, 365/185.22
See application file for complete search history.

(56) References Cited

FOREIGN PATENT DOCUMENTS

| | | |
|---|---|---|
| WO | 2012/043502 A1 | 4/2012 |
| WO | 2013/018282 A1 | 2/2013 |
| WO | 2013/047213 A1 | 4/2013 |
| WO | 2013/190741 A1 | 12/2013 |
| WO | 2014/208051 A1 | 12/2014 |
| WO | 2015/198573 A1 | 12/2015 |
| WO | 2016/042750 A1 | 3/2016 |

\* cited by examiner

SEMICONDUCTOR DEVICE AND PROGRAMMING METHOD THEREFOR

CROSS REFERENCE TO RELATED APPLICATIONS

This application is a National Stage of International Application No. PCT/JP2017/032606, filed Sep. 11, 2017, claiming priority based on Japanese Patent Application No. 2016-178734, filed Sep. 13, 2016, the contents of all of which are incorporated herein by reference in their entirety.

TECHNICAL FIELD

The present invention relates to a semiconductor device and programming method therefor. Particularly, the present invention relates to a semiconductor device equipped with a variable-resistance nonvolatile element and a programming method therefor.

BACKGROUND ART

With the miniaturization of the semiconductor integrated circuits, an integration degree of field effect transistors has risen at a pace of quadrupling in three years, thus allowing costs for photomask and design verification necessary for manufacturing integrated circuits to grow. As a result, a development cost of an application specific integrated circuit (ASIC) in which a user designs a fixed function in a custom-design manner in advance is rapidly increasing. In such a situation, a semiconductor device with which a designer can electrically program a desired circuit on a manufactured semiconductor chip, such as a field programmable gate array (FPGA), is drawing attention.

Incidentally, an FPGA has a problem that area efficiency is low and power consumption is large because the FPGA needs ten times or more of transistors compared with an ASIC in order to achieve the same function. In order to solve such a problem, research and development aiming to reduce an overhead of an FPGA and to reduce power consumption is being conducted. One of solutions to the above-described problem is to achieve a programmable wiring mounted with a variable resistance element (also called variable-resistance nonvolatile element) inside a multilayer wiring layer. The variable resistance elements include a resistance random access memory (ReRAM) using transition metal dioxide, a Nano Bridge (registered trademark) using an ion conductor, and the like.

PTL 1 discloses a variable resistance element using a solid ion conductor. The variable resistance element of PTL 1 includes an ion conductive layer, and a first electrode and a second electrode that are arranged adjacently to a counter surface of the ion conductive layer. The first electrode of the variable resistance element of PTL 1 is configured with a metal that can be ionized more easily than the second electrode, and the ion conductive layer is constituted of an electrolyte material including a metal ion of metal configuring the first electrode. In the variable resistance element of PTL 1, a resistance value of the ion conductor is adjusted by changing a polarity of applied voltage, thereby controlling a conductive state between the two electrodes.

An example in FIG. 14 is a crossbar circuit 100 in which a variable resistance element 110 of PTL 1 is arranged at an intersection point of buses in a crossbar. The crossbar circuit 100 of FIG. 14 includes a configuration in which variable resistance elements 110 are arranged at intersection points of a plurality of first wirings 121 to 126 and a plurality of second wirings 131 to 136. In FIG. 14, an element in an on-state is illustrated with a black square, and an element in an off-state is illustrated with a white square. The crossbar circuit 100 of FIG. 14 illustrates a wiring as a crossbar realized by putting variable resistance elements 110 on a diagonal line into the on-state.

PTL 2 discloses a crossbar switch using a variable resistance element as an ultra-large scale integration (ULSI). In the crossbar switch in PTL 2, it is disclosed that a variable resistance element is connected in series and used as a unit element.

An example in FIG. 17 is a crossbar circuit 200 in which a unit element 210 of PTL 2 is arranged at an intersection point of buses of a crossbar. The crossbar circuit 200 of FIG. 17 has a configuration in which unit elements 210 are arranged at intersection points of a plurality of first wirings 221 to 226 and a plurality of second wirings 231 to 236. In FIG. 17, an element in an on-state is illustrated with a black square, and an element in an off-state is illustrated with a white square. In the crossbar circuit 200 of FIG. 17, the unit element 210 is turned to the on-state by putting both of two variable resistance elements constituting the unit element 210 into the on-state, and the unit element 210 is turned to the off-state by putting both of the two variable resistance elements into the off-state. The crossbar circuit 200 of FIG. 17 illustrates a wiring as a crossbar realized by putting the unit elements 210 on a diagonal line into the on-state.

PTL 3 discloses a nonvolatile resistance network aggregate including two resistance networks in which a plurality of nonvolatile resistance elements are connected. The nonvolatile resistance network aggregate of PTL 3 performs writing in such a way that combined resistance values of the two resistor networks are different by using write means for writing into the two resistor networks.

PTL 4 discloses a content addressable memory cell using a variable-resistance nonvolatile storage element. The content addressable memory cell of PTL 4 includes a logical circuit that selects a current path in response to input data and a variable-resistance nonvolatile storage element that stores storage data, and includes a resistance network that changes a resistance value in response to a result of logical operation of input data and storage data. In addition, the content addressable memory cell of PTL 4 includes a charging/discharging circuit that changes delay time until outputting a signal input from a match line in response to the result of logical operation of input data and storage data.

CITATION LIST

Patent Literature

[PTL 1] Japanese Unexamined Patent Application Publication No. 2005-101535 A
[PTL 2] International Publication No. WO 2013/190741
[PTL 3] International Publication No. WO 2013/047213
[PTL 4] International Publication No. WO 2014/208051

SUMMARY OF INVENTION

Technical Problem

The crossbar circuit using the variable resistance element of PTL 1 has following problems.

FIG. 15 illustrates a state in which 1 bit of open failure occurs on a variable resistance element 110 arranged at an intersection point of a first wiring 123 and a second wiring 133 in the crossbar circuit 100 of FIG. 14. When the open failure as illustrated in FIG. 15 occurs, an input from the first wiring 123 is not transferred as an output of the second wiring 133.

FIG. 16 illustrates a state in which 1 bit of short circuit occurs on a variable resistance element 110 arranged at an intersection point of a first wiring 125 and a second wiring 133 in the crossbar circuit 100 of FIG. 14. When the short circuit as illustrated in FIG. 16 occurs, an input from the first wiring 123 and an input from the first wiring 125 collides, and an output from the second wiring 133 and an output from the second wiring 135 become uncertain.

In addition, the crossbar circuit using the variable resistance element of PTL 2 has following problems.

FIG. 18 illustrates a state in which 1 bit of open failure occurs on a unit element 210 arranged at an intersection point of a first wiring 223 and a second wiring 233 in the crossbar circuit 200 of FIG. 17. Occurrence of the open failure as illustrated in FIG. 18 leads to a malfunction of the circuit. FIG. 19 illustrates a state in which 1 bit of short circuit occurs on a unit element 210 arranged at an intersection point of a first wiring 225 and the second wiring 233 in the crossbar circuit 200 of FIG. 17. Occurrence of the short circuit as illustrated in FIG. 19 does not affect a circuit operation of the crossbar circuit 200.

In other words, the crossbar circuits of PTLs 1 and 2 arranged with variable resistance elements have a problem that a failure of 1 bit may prevent the circuit from operating.

In addition, although techniques for preventing an error are disclosed in PTL 3 and PTL 4, a technique for recovering from an error is not disclosed.

An objective of the present invention is to provide a highly reliable crossbar circuit that enables salvation of reversal of a resistive state of a variable resistance element in order to solve any of the above-mentioned problems.

Solution to Problem

A semiconductor device according to an aspect of the present invention includes a first wiring being extended to a first direction, a second wiring being extended to a second direction that crosses the first direction, a unit element group having a configuration in which at least two unit elements are arranged in parallel, the unit element including at least two variable-resistance two-terminal elements being connected in series, the unit element group being connected to the first wiring and the second wiring, a first programming driver that changes a resistive state of a two-terminal element constituting the unit element group via the first wiring, a first selection transistor in which one of a source terminal and a drain terminal is connected to the first wiring and the other terminal is connected to the first programming driver, a second programming driver that changes a resistive state of a two-terminal element constituting the unit element group via the second wiring, and a second selection transistor in which one of a source terminal and a drain terminal is connected to the second wiring and the other terminal is connected to the second programming driver.

In a programming method according to an aspect of the present invention, a programming is performed on a crossbar circuit including a first wiring being extended to a first direction, a second wiring being extended to a second direction that crosses the first direction, a third wiring being paired with the first wiring and extended to the first direction, and at least two unit element groups in each of which at least two unit elements are arranged in parallel, the unit element including at least two variable-resistance two-terminal elements being connected in series via an intermediate node, the unit element group being arranged between the first wiring and the second wiring and between the third wiring and the second wiring, by changing a resistive state of a two-terminal element of a unit element being a target of programming by applying a voltage that exceeds a reference value between at least one of the first wiring, the second wiring, and the third wiring, and the intermediate node.

Advantageous Effects of Invention

The present invention can provide a highly reliable crossbar circuit that enables salvation of reversal of a resistive state of a variable resistance element.

EXAMPLE EMBODIMENT

Figure 1:
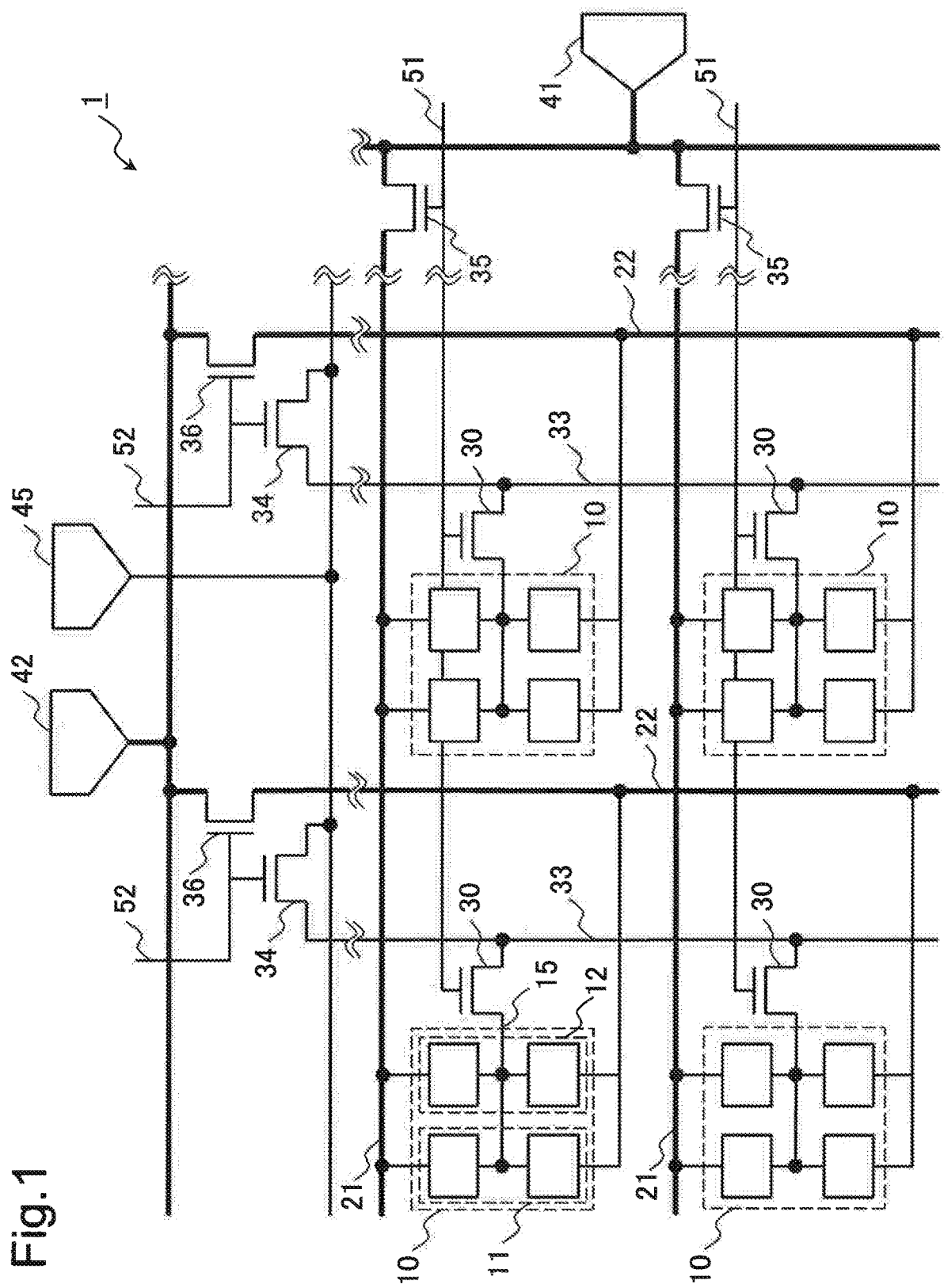
FIG. 1 is a conceptual diagram illustrating a configuration of a semiconductor device according to the first example embodiment of the present invention.

Hereinafter, with reference to the figures, the example embodiments of the present invention are described in detail. Although the example embodiments are described with a technically preferable limitation, the example embodiments are not intended to limit the scope of the invention. In all figures used for the description of the example embodiments, like reference numerals are assigned to the similar parts unless there is a particular reason. In addition, in the example embodiments, a repeated description about a similar configuration and an operation may be omitted.

First Example Embodiment

Figure 2:
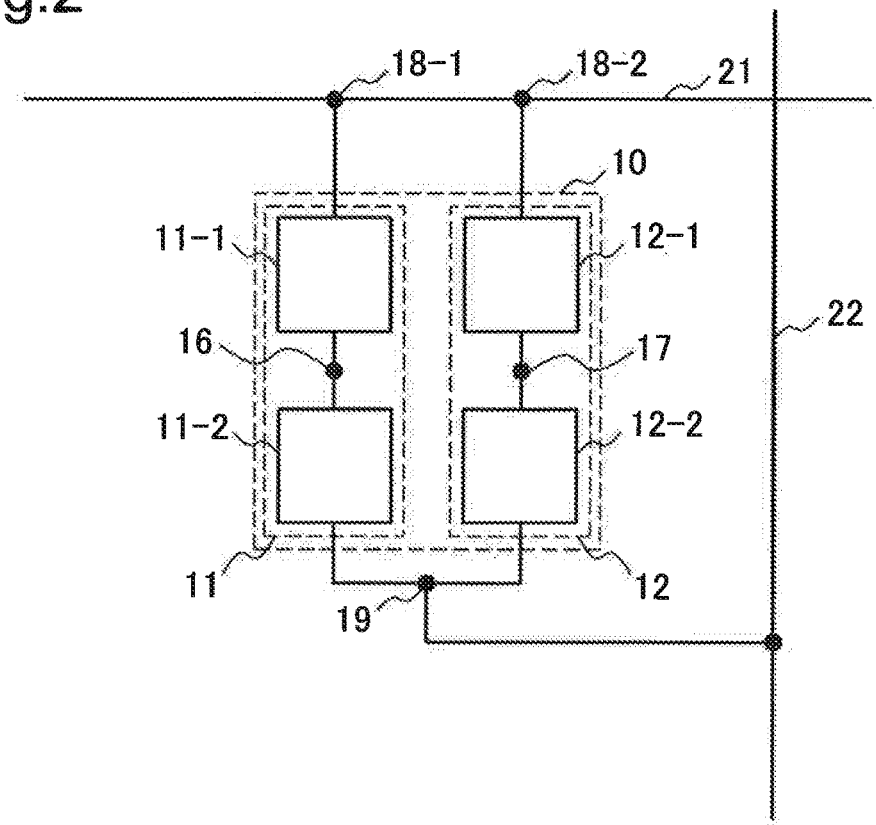
FIG. 2 is a conceptual diagram illustrating a configuration of a unit element group included in the semiconductor device according to the first example embodiment of the present invention.

With reference to the figures, the semiconductor device according to the first example embodiment of the present invention is described. FIG. 1 is a conceptual diagram illustrating a configuration of a semiconductor device 1 according to the example embodiment. FIG. 2 is a conceptual diagram illustrating a unit element group 10 included in the semiconductor device 1 of FIG. 1.

As illustrated in FIG. 1, the semiconductor device 1 includes a unit element group 10 that includes a first unit element 11 and a second unit element 12, a first wiring 21 and a second wiring 22. The semiconductor device 1 also includes an intermediate node selection transistor 30, a first selection transistor 35, and a second selection transistor 36. The semiconductor device 1 further includes a first programming driver 41, a second programming driver 42 and an intermediate node programming driver 45. The semiconductor device 1 also includes an intermediate node program line 33, a first decode signal line 51 and a second decode signal line 52.

The semiconductor device 1 is a crossbar circuit having a configuration in which a plurality of unit element groups 10 that are arranged in an array are connected to the first wiring 21 and the second wiring 22. The first wiring 21 is extended to a first direction. The second wiring 22 is extended to a second direction that crosses the first direction.

The array configuration of the semiconductor device 1 is configured by two groups. A first group is a group that includes the first wiring 21, the first selection transistor 35 and the first decode signal line 51. A second group is a group that includes the second wiring 22, the second selection transistor 36, the second decode signal line 52, the intermediate node program line 33 and the intermediate node common selection transistor 34. The semiconductor device 1 may include at least one first group and one second group. However, in the following example, the semiconductor device 1 includes a plurality of first groups and second groups.

The semiconductor device 1 has a configuration in which a unit element group 10 is arranged at a position where the first wiring 21 and the second wiring 22 cross when a plurality of first wirings 21 and a plurality of second wirings 22 are arranged in such a way as to cross in planar view. In the example of FIG. 1, the first wiring 21 and the second wiring 22 are configured in such a way as to cross at right angles in planar view. In FIG. 1, only a part of the semiconductor device 1 is illustrated, and similar configurations are omitted.

The unit element group 10 has a configuration in which at least two variable-resistance two-terminal elements (hereinafter referred to as variable resistance elements) are connected in series via an intermediate node 15. The variable resistance element is also referred to as a variable-resistance nonvolatile element.

The unit element group 10 has a configuration in which the first unit element 11 and the second unit element 12 are connected in parallel. The unit element group 10 is arranged at an intersection point of a crossbar configured by the first wiring 21 and the second wiring 22. According to the design of the crossbar circuit, the unit element group 10 may not be arranged at all of the intersection points of the crossbar, and an intersection point at which a unit element group 10 is not arranged may exist.

As illustrated in FIG. 2, the first unit element 11 has a configuration in which a variable resistance element 11-1 and a variable resistance element 11-2 are connected in series. The variable resistance element 11-1 and the variable resistance element 11-2 are connected in series via an intermediate node 16. Similarly, the second unit element 12 has a configuration in which a variable resistance element 12-1 and a variable resistance element 12-2 are connected in series. The variable resistance element 12-1 and the variable resistance element 12-2 are connected in series via an intermediate node 17. The variable resistance elements 11-1, 11-2, 12-1 and 12-2 are variable-resistance two-terminal elements whose resistive state changes when an applied voltage exceeds a reference value.

One end of the first unit element 11 is connected to the first wiring 21 via a terminal 18-1. Similarly, one end of the second unit element 12 is connected to the first wiring 21 via a terminal 18-2. The other ends of the first unit element 11 and the second unit element 12 are connected to the second wiring 22 via a terminal 19. Although not illustrated, the other ends of the first unit element 11 and the second unit element 12 may be connected to the second wiring 22 via separate terminals.

The intermediate node 16 and the intermediate node 17 illustrated in FIG. 2 are connected to the intermediate node 15 illustrated in FIG. 1. As illustrated in FIG. 1, the intermediate node 15 is connected to the intermediate node program line 33 and the first decode signal line 51 via the intermediate node selection transistor 30.

As illustrated in FIG. 1, the intermediate node selection transistor 30 is arranged for each unit element group 10. One of a source terminal and a drain terminal of the intermediate node selection transistor 30 is connected to the intermediate node 15, and the other terminal is connected to the intermediate node program line 33. A gate terminal of the intermediate node selection transistor 30 is connected to the first decode signal line 51.

The intermediate node program line 33 is connected to the intermediate node programming driver 45 via the intermediate node common selection transistor 34.

One of a source terminal and a drain terminal of the intermediate node common selection transistor 34 is connected to the intermediate node program line 33. The other of the source terminal and the drain terminal of the intermediate node common selection transistor 34 is connected to the intermediate node programming driver 45. A gate terminal of the intermediate node common selection transistor 34 is connected to the second decode signal line 52.

One of a source terminal and a drain terminal of the first selection transistor 35 is connected to the first wiring 21. The other of the source terminal and the drain terminal of the first selection transistor 35 is connected to the first programming driver 41. The gate terminal of the first selection transistor 35 is connected to the first decode signal line 51 that is common with the gate terminal of the intermediate node selection transistor 30.

One of a source terminal and a drain terminal of the second selection transistor 36 is connected to the second wiring 22. The other of the source terminal and the drain terminal of the second selection transistor 36 is connected to the second programming driver 42. A gate terminal of the second selection transistor 36 is connected to the second decode signal line 52 that is common with the gate terminal of the intermediate node common selection transistor 34.

The first programming driver 41 is connected to the first wiring 21 via the first selection transistor 35. The first programming driver 41 changes the resistive state of the variable resistance element configuring the unit element group 10 via the first wiring 21.

The second programming driver 42 is connected to the second wiring 22 via the second selection transistor 36. The second programming driver 42 changes the resistive state of the variable resistance element configuring the unit element group 10 via the second wiring 22.

The intermediate node programming driver 45 is connected to one of a source terminal and a drain terminal of the intermediate node common selection transistor 34. The intermediate node programming driver 45 changes the resistive state of the variable resistance element configuring the unit element group 10 via the intermediate node program line 33.

Here, the first programming driver 41, the second programming driver 42 and the intermediate node programming driver 45 are described in detail.

Figure 3:
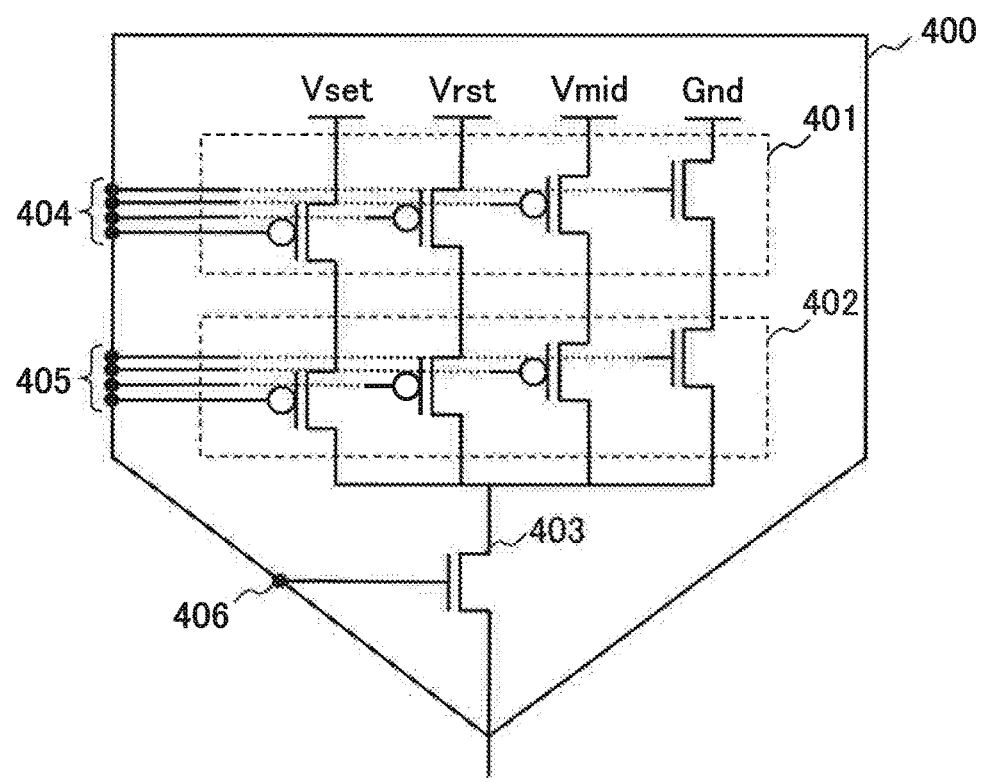
FIG. 3 is a conceptual diagram illustrating a configuration of a programming driver of the semiconductor device according to the first example embodiment of the present invention.

FIG. 3 is a conceptual diagram of the programming driver 400 that achieves the first programming driver 41, the second programming driver 42 and the intermediate node programming driver 45. The programming driver 400 changes the resistive state of a switch. The programming driver 400 provides a state in which a set voltage $V_{set}$, a reset voltage $V_{rst}$, an intermediate voltage $V_{mid}$ and a ground voltage Gnd of the first unit element 11 and the second unit element 12 are provided, and a high impedance state.

Each power supply line of the set voltage $V_{set}$, reset voltage $V_{rst}$, intermediate voltage $V_{mid}$ and ground voltage Gnd is connected to an external selection switching element via a constant current transistor 401, output voltage selection transistor 402 and an output transistor 403.

The constant current transistor 401 operates as a constant current source by controlling the gate voltage in the saturated region. The constant current transistor 401 controls the current in a constant value in response to the input signal from the current control terminal 404.

Each output voltage selection transistor 402 is a transistor for selecting one of the set voltage $V_{set}$, reset voltage $V_{rst}$, intermediate voltage $V_{mid}$ and ground voltage Gnd. Each output voltage selection transistor 402 is controlled by an input signal from the output voltage selection terminal 405 in such a way that one of the transistors is in an on-state and the other transistors are in an off-state.

The output transistor 403 puts the programming driver 400 into a voltage output state or the high impedance state. The output transistor 403 is controlled by an input signal from the enable terminal 406.

Here, with reference to the figures, an example in which a failure occurs when operating the unit element group 10 included in the semiconductor device according to the first example embodiment of the present invention is described. FIG. 4 to FIG. 7 are conceptual diagrams for comparing the operation state of the unit element group 10 in the normal operation state and a state in which a failure occurs.

Figure 4:
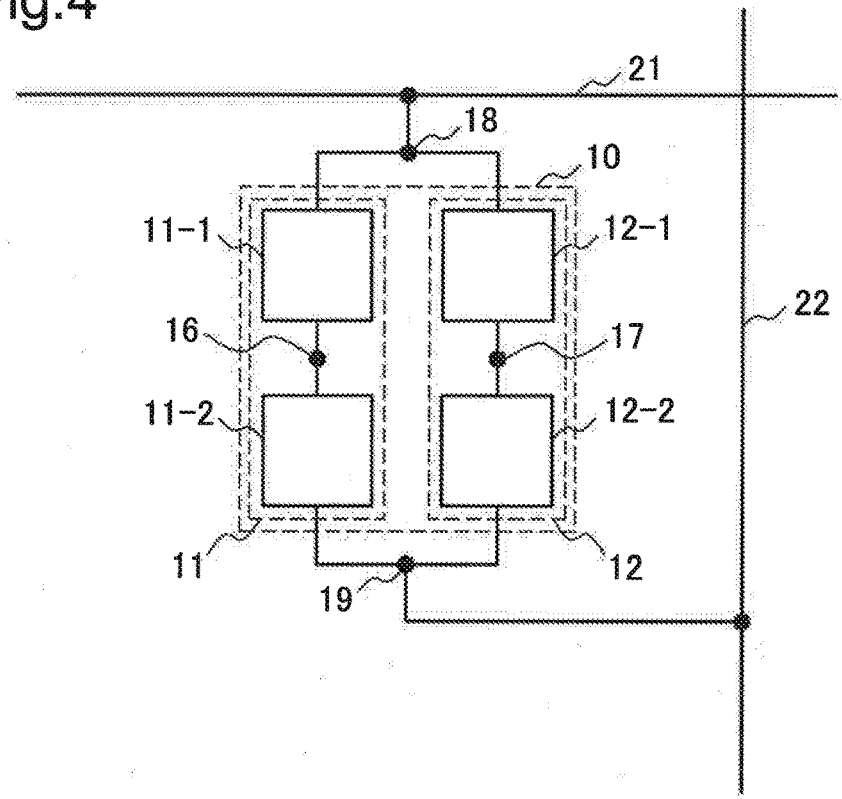
FIG. 4 is a diagram for describing an operation state of the semiconductor device according to the first example embodiment of the present invention.

FIG. 4 illustrates an example in which one end of the first unit element 11 and one end of the second unit element 12 are connected by a terminal 18, and the other ends are connected by a terminal 19. The unit element group 10 is connected to the first wiring 21 via the terminal 18, and connected to the second wiring 22 via the terminal 19. The semiconductor device 1 operates normally when an open failure or a short circuit occurs to one arbitrary variable resistance element out of four variable resistance elements configuring the unit element group 10.

Figure 5:
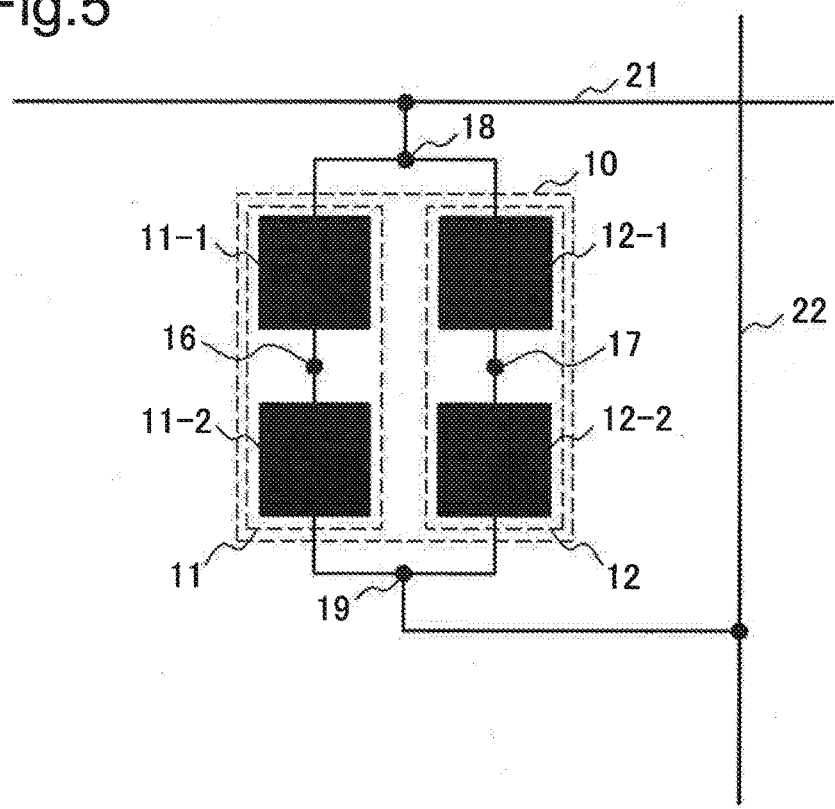
FIG. 5 is a diagram for describing an operation state of the semiconductor device according to the first example embodiment of the present invention.

For example, as illustrated in FIG. 4, when all the variable resistance elements (variable resistance elements 11-1, 11-2, 12-1 and 12-2) are in an off-state, the unit element group 10 operates as being in the off-state. Moreover, as illustrated in FIG. 5, when all the variable resistance elements (variable resistance elements 11-1, 11-2, 12-1 and 12-2) are in an on-state, the unit element group 10 operates as being in the on-state.

Figure 6:
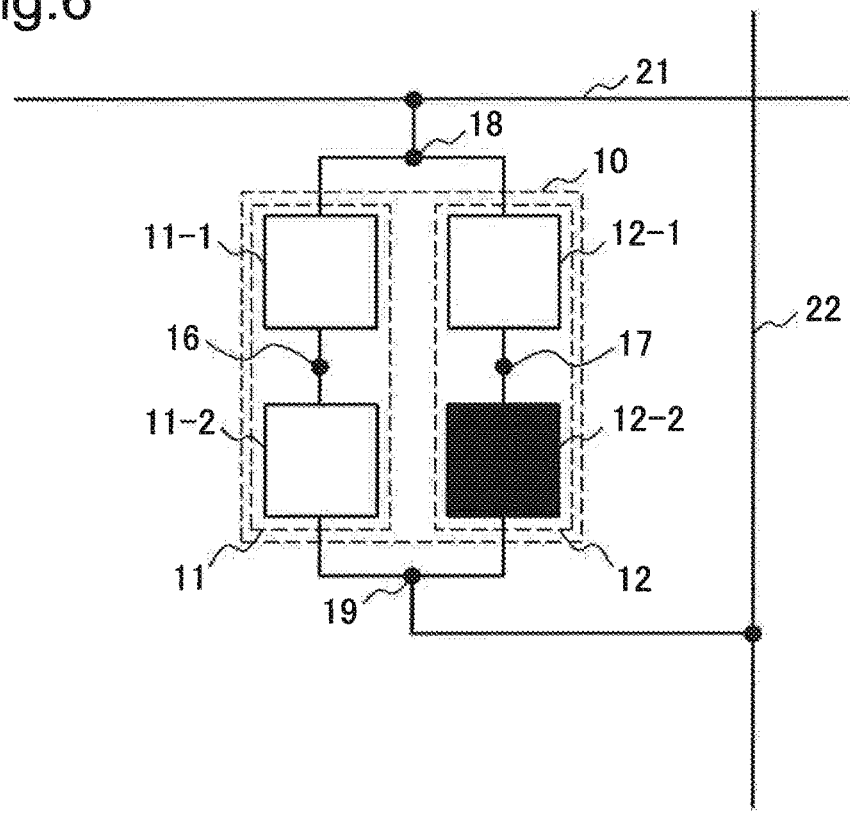
FIG. 6 is a diagram for describing an operation state of the semiconductor device according to the first example embodiment of the present invention.
Figure 7:
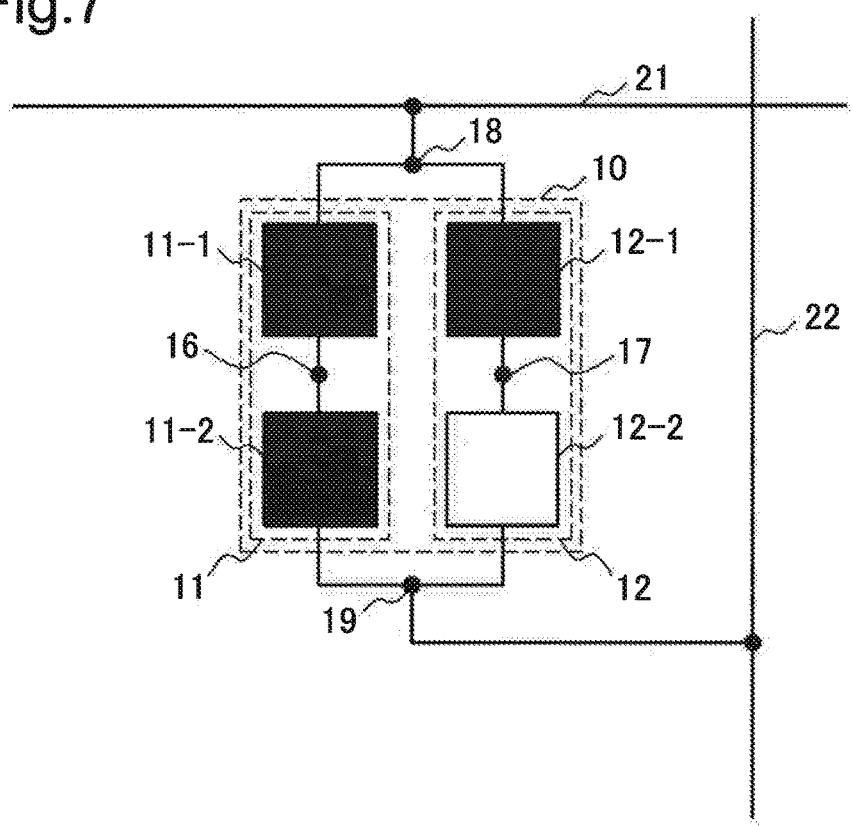
FIG. 7 is a diagram for describing an operation state of the semiconductor device according to the first example embodiment of the present invention.

By the way, as illustrated in FIG. 6, when a short circuit occurs to one arbitrary element (the variable resistance element 12-2 in FIG. 6), the unit element group 10 maintains the off-state. Moreover, as illustrated in FIG. 7, when an open failure occurs to one arbitrary element (the variable resistance element 12-2 in FIG. 7), the unit element group 10 maintains the on-state.

As described above, according to the example embodiment, when a failure of 1 bit occurs when bit-accessing in order to read an element state, the correct resistive state can be acquired from the other 3 bits. Thus, the expected value can be written back on the bit with failure. In the example embodiment, by including the modes of detection of resistive state and writing back in the operation mode, the redundancy of the crossbar circuit is not lost.

Moreover, when 2 bits of failure occurs, the correct resistive state cannot be acquired, however, the detection of failure is still possible. That is to say, by using the unit element group 10 of the example embodiment, a safe mode that assures a minimum operation can be provided by reporting the detection result to the system.

Figure 8:
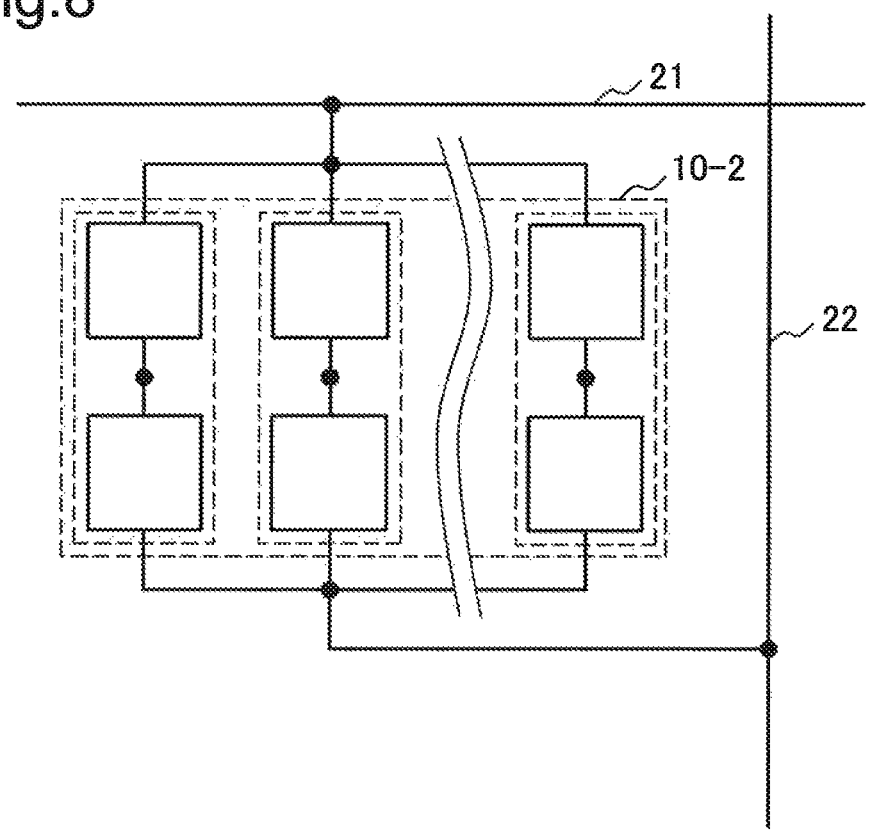
FIG. 8 is a conceptual diagram illustrating a configuration of a modification of a unit element group included in the semiconductor device according to the first example embodiment of the present invention.

In FIG. 4 to FIG. 7, the degree of parallelism of unit elements is 2, however, as illustrated in FIG. 8, the degree of parallelism may be 3 or more. FIG. 8 illustrates an example with unit element groups 10-2 having the degree of parallelism of 3 or more. In the case of FIG. 8, when failures occur to more variable resistance elements, the unit element group 10 operates normally.

As described above, the unit element group of the example embodiment has a configuration in which a plurality of unit elements are connected in parallel, in each of which variable resistance elements are connected in series. As a result, the crossbar circuit using the unit element group of the example embodiment operates normally when an open failure or short circuit of 1 bit occurs to a variable-resistance element.

Here, a procedure for putting a unit element that is arranged at an intersection point of a desired first wiring 21 and a second wiring 22 into an on-state when all the unit elements configuring the semiconductor device 1 arranged in an array are in an off-state is described. The variable resistance element included in the unit element group 10 is assumed to be a bipolar type element. In addition, each variable resistance element has an active electrode and an inactive electrode. In order to put the variable resistance element into a low resistive state, a high voltage is applied to the active electrode. On the other hand, in order to put the variable resistance element into a high resistive state, a high voltage is applied to the inactive electrode. Here, the active electrode of each variable resistance element is connected to one of the side of the first wiring 21 and the side of the second wiring 22, and the inactive electrode of each variable resistance element is connected to the side of the intermediate node 15.

The first programming driver 41, the second programming driver 42 and the intermediate node programming driver 45 are set to output an intermediate voltage $V_{mid}$.

Then, all the first selection transistor 35 are put into a conductive state by all the first decode signal lines 51, and all the first wirings 21 are set to the intermediate voltage $V_{mid}$. Moreover, all the second selection transistors 36 are put into a conductive state by all the second decode signal lines 52, and all the second wirings 22 are set to an intermediate voltage $V_{mid}$. In addition, all the intermediate node selection transistor 30 are put into a conductive state by all the first decode signal lines 51 and all the second decode signal lines 52, and all the intermediate nodes 15 are set to the intermediate voltage $V_{mid}$.

Moreover, all the first selection transistors 35, all the second selection transistors 36, and all the intermediate node selection transistors 30 are put into a non-conductive state.

Then, the first programming driver 41 is set to output a set voltage $V_{set}$, the intermediate node programming driver 45 is set to output a ground voltage Gnd, and the second programming driver 42 is put into a high impedance state.

Then, a selection level (High level in this example) is applied to the first decode signal line 51 and the second decode signal line 52 that are related to a unit element that is the target of programming, and the intermediate node selection transistor 30 that is connected to the unit element that is the target of programming is put into a conductive state. As a result, a set voltage $V_{set}$ is applied to the variable resistance element that is connected to the side of the first wiring 21 of each unit element. The above-described procedures allow the variable resistance element to transfer to the on-state.

In a unit element that is not the target of programming, at least one of the intermediate node selection transistor 30 and the intermediate node common selection transistor 34 is in the unselected state. As a result, since the intermediate node 15 is not biased to the Gnd electric potential and the program voltage is not applied, an unintended miswriting is prevented.

Then, the programming of the variable resistance element that is connected to the side of the second wiring 22 of each unit element is performed by the similar procedure.

In other words, all the first selection transistors 35, all the second selection transistors 36 and all the intermediate node selection transistor 30 are returned to the non-conductive state. The settings of the first programming driver 41, the second programming driver 42 and the intermediate node programming driver 45 are restored to output the intermediate voltage $V_{mid}$.

Moreover, all the first selection transistors 35, all the second selection transistors 36 and all the intermediate node selection transistors 30 are put into the conductive state, and all the first wirings 21, all the second wirings 22 and all the intermediate nodes 15 are set to output the intermediate voltage $V_{mid}$.

In addition, the first programming driver 41 is put into a high impedance state, the intermediate node programming driver 45 is set to output the Gnd, and the second programming driver 42 is set to output the $V_{set}$.

Then, a selection level (High level in this example) is applied to the first decode signal line 51 or the second decode signal line 52 of a unit element that is the target of programming, and the selection transistor that is connected to the unit element that is the target of programming is put into a conductive state. As a result, a set voltage $V_{set}$ is applied to the variable resistance element connected to the side of the second wiring 22 of the unit element. The above-described procedures allow the variable resistance element to transfer to the on-state.

With the above procedures, all the variable resistance elements of the target unit elements are put into the on-state, the programming can be completed.

In the example embodiment, the variable resistance element is a bipolar variable resistance element. However, the variable resistance element may be a unipolar variable resistance element or a combination of a unipolar variable resistance element and a bipolar variable resistance element. The polarity of the bipolar variable resistance elements may be aligned and connected, or the bipolar variable resistance elements may be connected in such a way that the polarities thereof are the opposite. The degree of parallelism of unit elements is 2 in the description, however, a degree of parallelism may be 3 or more.

As described above, the semiconductor device of the example embodiment can provide a highly reliable crossbar circuit that enables salvation of reversal of a resistive state of a variable resistance element.

Second Example Embodiment

With reference to the figures, the semiconductor device according to the second example embodiment of the present invention is described. Detailed description of the configuration similar to the first example embodiment is omitted.

Figure 9:
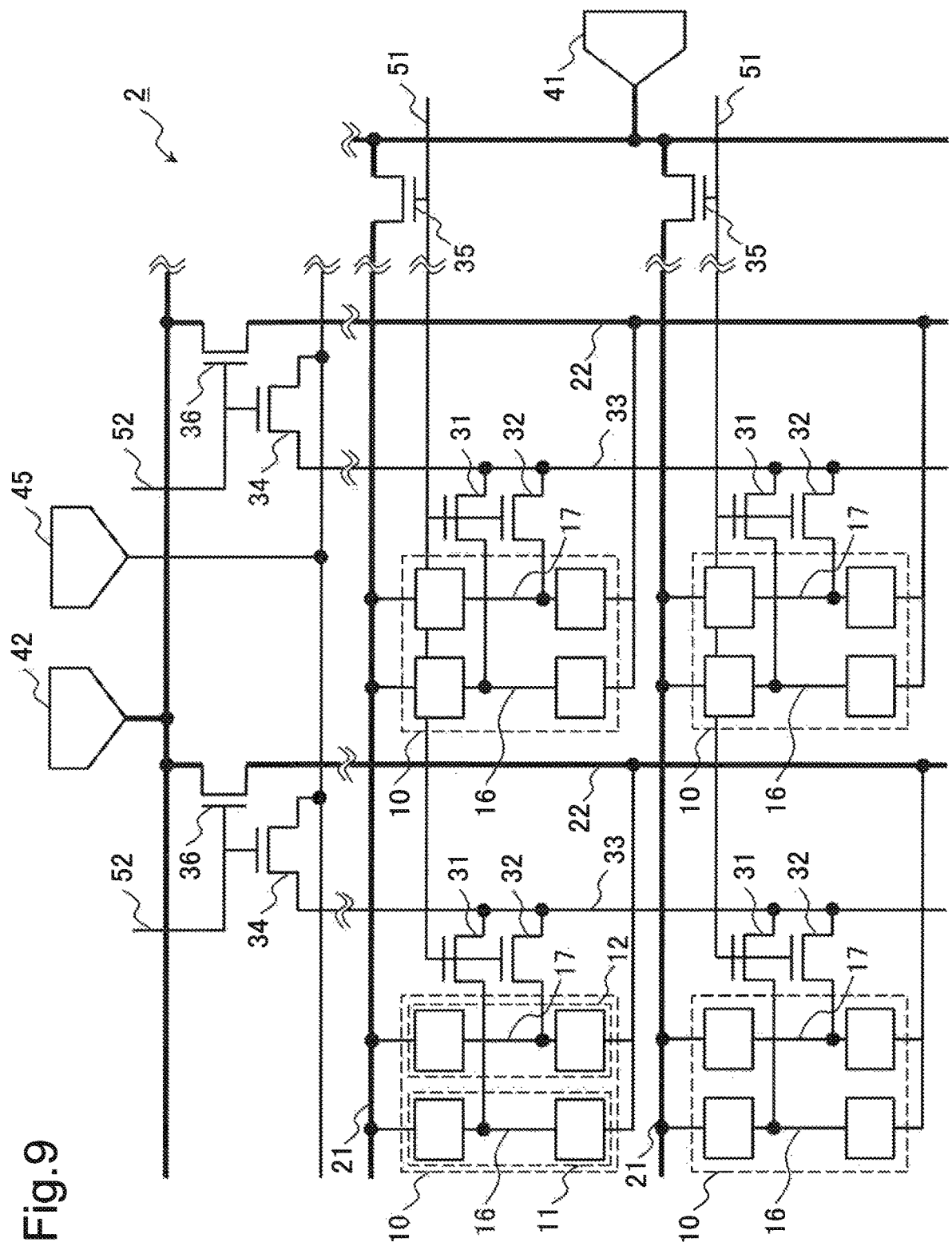
FIG. 9 is a conceptual diagram illustrating a configuration of a semiconductor device according to the second example embodiment of the present invention.

FIG. 9 is a conceptual diagram illustrating a configuration of a semiconductor device 2 according to the example embodiment. In the semiconductor device 2 of the example embodiment, an intermediate node 16 of a first unit element 11 and an intermediate node 17 of a second unit element 12 are connected to an intermediate node program line 33 and a first decode signal line 51 respectively, unlike the semiconductor device 1 of the first example embodiment. Therefore, the semiconductor device 2 includes two intermediate node selection transistors (a first intermediate node selection transistor 31 and a second intermediate node selection transistor 32).

As illustrated in FIG. 9, the intermediate node 16 of the first unit element 11 is connected to the intermediate node program line 33 and the first decode signal line 51 via the first intermediate node selection transistor 31. One of a source terminal and a drain terminal of the first intermediate node selection transistor 31 is connected to the intermediate node 16, and the other terminal is connected to the intermediate node program line 33. A gate terminal of the first intermediate node selection transistor 31 is connected to the first decode signal line 51.

Similarly, the intermediate node 17 of the second unit element 12 is connected to the intermediate node program line 33 and the first decode signal line 51 via the second intermediate node selection transistor 32. One of a source terminal and a drain terminal of the second intermediate node selection transistor 32 is connected to the intermediate node 17, and the other terminal is connected to the intermediate node program line 33. A gate terminal of the second intermediate node selection transistor 32 is connected to the first decode signal line 51.

As described above, in the semiconductor device of the example embodiment, an intermediate node selection transistor is arranged for each unit element configuring a unit element group. The similar effect as the semiconductor device of the first example embodiment can be obtained with the configuration of the semiconductor device of the example embodiment since the resistive state of each variable resistance element configuring the unit cell group can be set to the same state.

Third Example Embodiment

With reference to the figures, the semiconductor device according to the third example embodiment of the present invention is described. Detailed description for the configuration similar to the first and second example embodiments is omitted.

Figure 10:
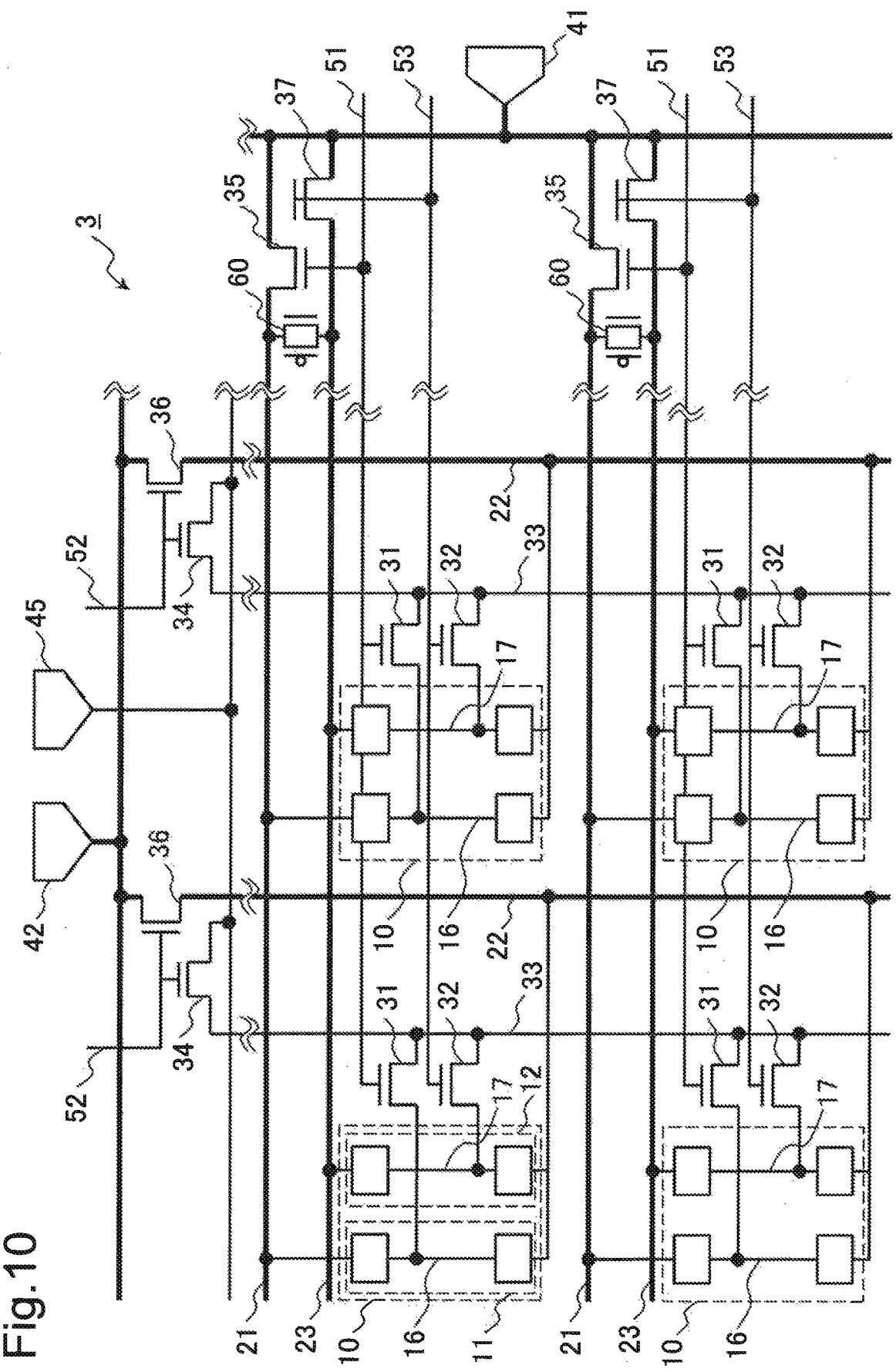
FIG. 10 is a conceptual diagram illustrating a configuration of a semiconductor device according to the third example embodiment of the present invention.
Figure 11:
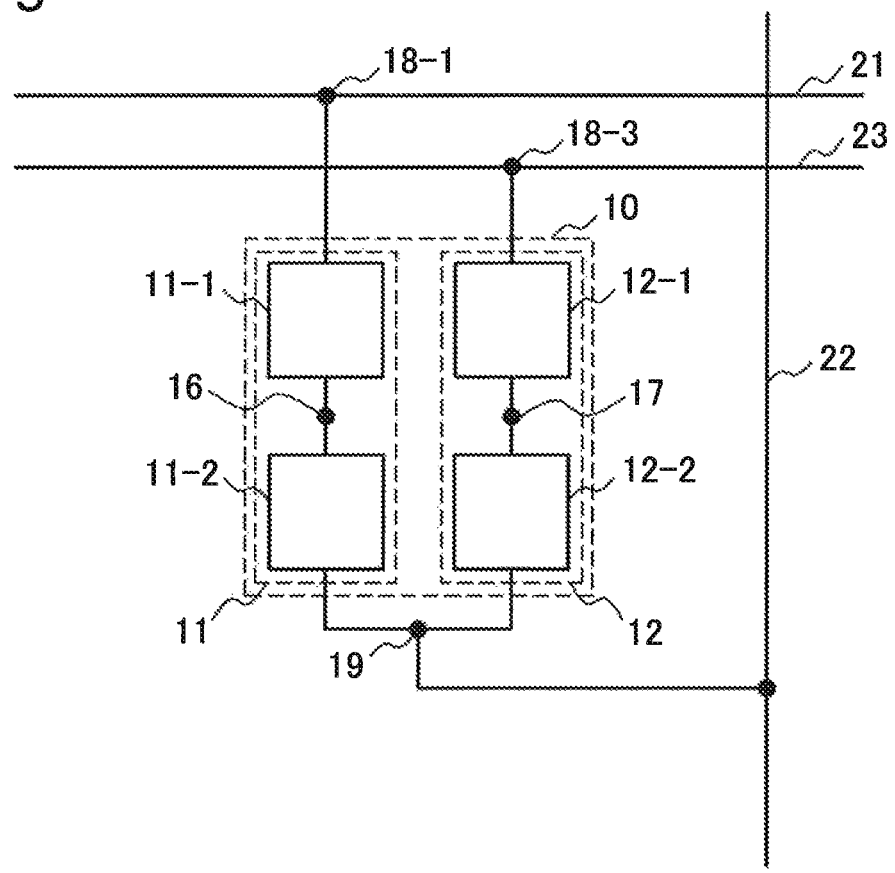
FIG. 11 is a conceptual diagram illustrating a configuration of a unit element group included in the semiconductor device according to the third example embodiment of the present invention.

FIG. 10 is a conceptual diagram illustrating a configuration of a semiconductor device 3 according to the example embodiment. FIG. 11 is a conceptual diagram illustrating a unit element group 10 included in the semiconductor device 3 of FIG. 10. The semiconductor device 3 of the example embodiment includes a third wiring 23 in addition to a first wiring 21 and a second wiring 22, unlike the semiconductor device 1 of the first example embodiment. The third wiring 23 is paired with the first wiring 21 and is extended to a first direction.

The semiconductor device 3 includes the third wiring 23, a third selection transistor 37, a third decode signal line 53 and a pass transistor 60 in addition to the semiconductor device 2 of the second example embodiment.

The third wiring 23 is paired with the first wiring 21, and arranged in parallel. The third wiring 23 is arranged in such a way as to cross the second wiring 22, in the similar way as the first wiring 21. The first wiring 21 and the third wiring 23 are connected by the pass transistor 60.

The first unit element 11 is arranged at an intersection point of the first wiring 21 and the second wiring 22. The second unit element 12 is arranged at an intersection point of the second wiring 22 and the third wiring 23. As illustrated in FIG. 11, one end of the first unit element 11 is connected to the first wiring 21 via a terminal 18-1. On the other hand, one end of the second unit element 12 is connected to the third wiring 23 via a terminal 18-3. The other ends of the first unit element 11 and the second unit element 12 are connected to the second wiring 22 via a terminal 19.

The intermediate node 16 of the first unit element 11 is connected to the intermediate node program line 33 and the first decode signal line 51 via the first intermediate node selection transistor 31.

One of a source terminal and a drain terminal of the first intermediate node selection transistor 31 is connected to the intermediate node 16, and the other terminal is connected to the intermediate node program line 33. A gate terminal of the first intermediate node selection transistor 31 is connected to the first decode signal line 51.

The intermediate node 17 of the second unit element 12 is connected to the intermediate node program line 33 and the third decode signal line 53 via the second intermediate node selection transistor 32.

One of a source terminal and a drain terminal of the second intermediate node selection transistor 32 is connected to the intermediate node 17, and the other terminal is connected to the intermediate node program line 33. A gate terminal of the second intermediate node selection transistor 32 is connected to the third decode signal line 53.

One of source terminal and the drain terminal of the first selection transistor 35 is connected to the first wiring 21, and the other terminal is connected to the first programming driver 41. One of the source terminal and the drain terminal of the third selection transistor 37 is connected to the third wiring 23, and the other terminal is connected to the first programming driver 41.

The pass transistor 60 is connected to the first wiring 21 and the third wiring 23. When the semiconductor device 3 operates as a crossbar circuit (when no programming is performed), the pass transistor 60 is put into a conductive state. By putting the pass transistor 60 into the conductive state, the first wiring 21 and the third wiring 23 become the substantially common signal lines. On the other hand, when a programming is performed, the pass transistor 60 is put into a non-conductive state. By putting the pass transistor 60 into the non-conductive state, all the variable resistance elements can be uniquely addressed, and the operation state of each variable resistance element can be individually set.

With the semiconductor device of the example embodiment, a unit element can be programmed in the similar programming method described in the first example embodiment. Moreover, the semiconductor device of the example embodiment allows an individual programming of each unit element. That is to say, in the semiconductor device of the example embodiment, a group of the first wiring and the first decode signal line and a group of the third wiring and the third decode signal line can be individually programmed. Thus, a characteristic of the semiconductor device of the example embodiment is that all the variable resistance elements can be uniquely addressed. This characteristic is helpful for reducing a write disturbance and for increasing precision of reading a resistive state.

The pass transistor is put into a conductive state when providing a function as a crossbar circuit provided by the semiconductor device of the example embodiment. As a result, the first wiring and the third wiring become the substantially common signal lines, and the circuit becomes equal to the example embodiment 1 in which two unit elements are connected in parallel at an intersection point in the crossbar. Therefore, the example embodiment can improve the reliability of the crossbar circuit provided by the semiconductor device even more.

Fourth Example Embodiment

With reference to the figures, the semiconductor device (hereinafter referred to as a reconfiguration logical circuit) according to the fourth example embodiment of the present invention is described. A reconfiguration logical circuit 4 uses a crossbar circuit included in the semiconductor devices 1 to 3 disclosed in the first to third example embodiments.

Figure 12:
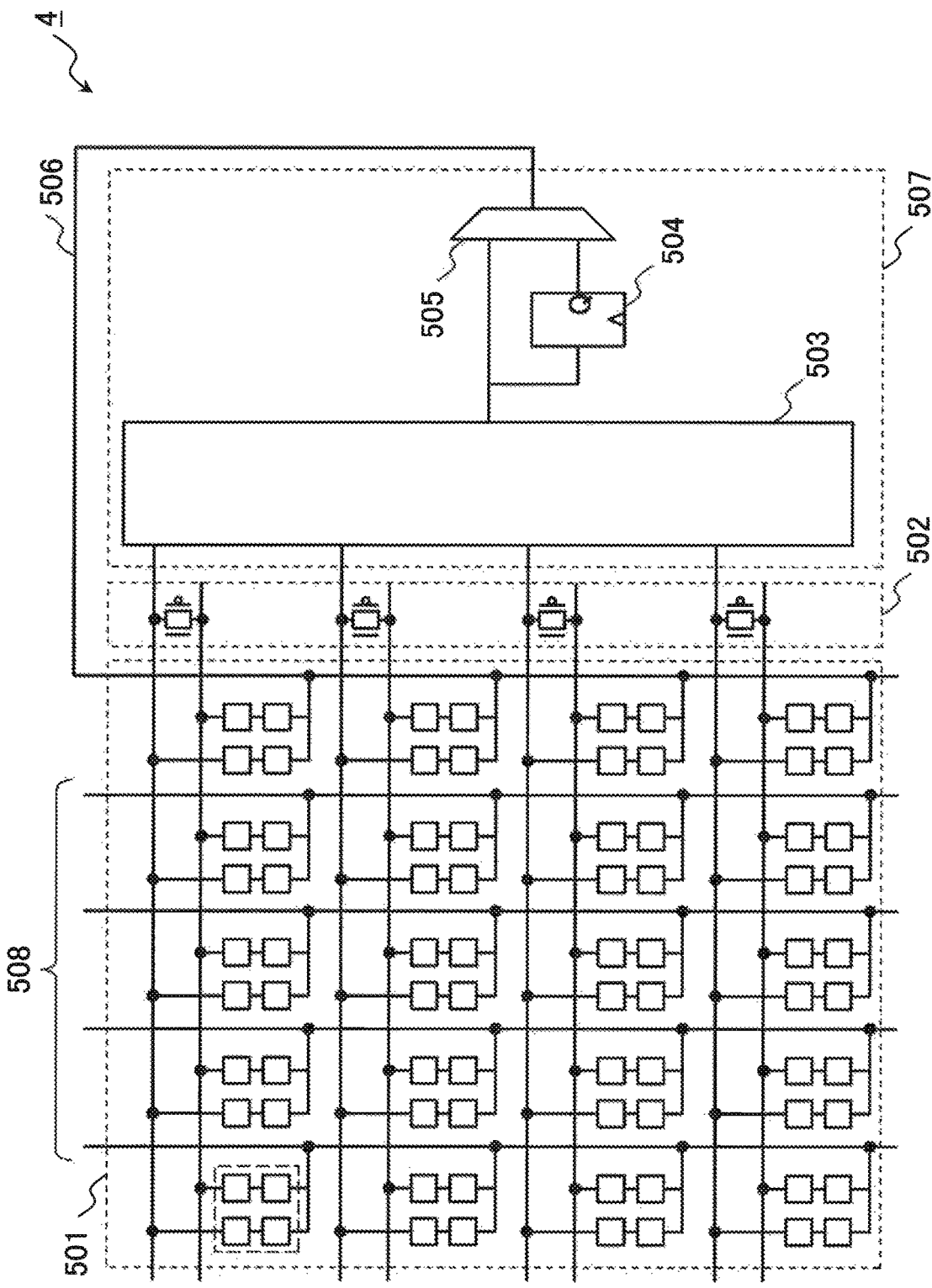
FIG. 12 is a conceptual diagram illustrating a configuration of a reconfiguration logical circuit according to the fourth example embodiment of the present invention.

As illustrated in FIG. 12, the reconfiguration logical circuit 4 includes a crossbar circuit 501, a pass transistor 502, a lookup table circuit 503, a flip flop 504 and a selector 505. The lookup table circuit 503, flip flop 504 and the selector 505 form a logic block 507. The crossbar circuit 501 includes an input 508, and using the crossbar circuit 501, an arbitrary input is connected to the lookup table circuit 503.

Here, in the crossbar circuit 501 illustrated in FIG. 12, various elements of the crossbar circuit described in each example embodiment that are necessary for programming are omitted. The connection function of the crossbar circuit 501 is achieved by turning on/off the unit element to which a variable resistance element is serially connected.

When operating as a crossbar circuit 501, the pass transistor 502 is put into a conductive state. In addition, as a suitable example, the output 506 of the logic block 507 is fed back to the lookup table circuit 503 via the crossbar circuit 501.

According to the example embodiment, by expanding a circuit illustrated in FIG. 12, and by linking a large number of circuits, a function as a reconfiguration circuit in a larger scale can be provided.

Fifth Example Embodiment

With reference to the figures, the semiconductor device (hereinafter referred to as a reconfiguration logical circuit) according to the fifth example embodiment of the present invention is described. A reconfiguration logical circuit 5 has a unit element whose degree of parallelism is 3, and includes a triple modular redundant (TMR) circuit instead of the pass transistor of the fourth example embodiment. For example, the TMR circuit is a circuit that achieves a majority logic that gives an output expressed by a Boolean expression of (A and B) or (B and C) or (C and A) when three values of A, B and C are input.

Figure 13:
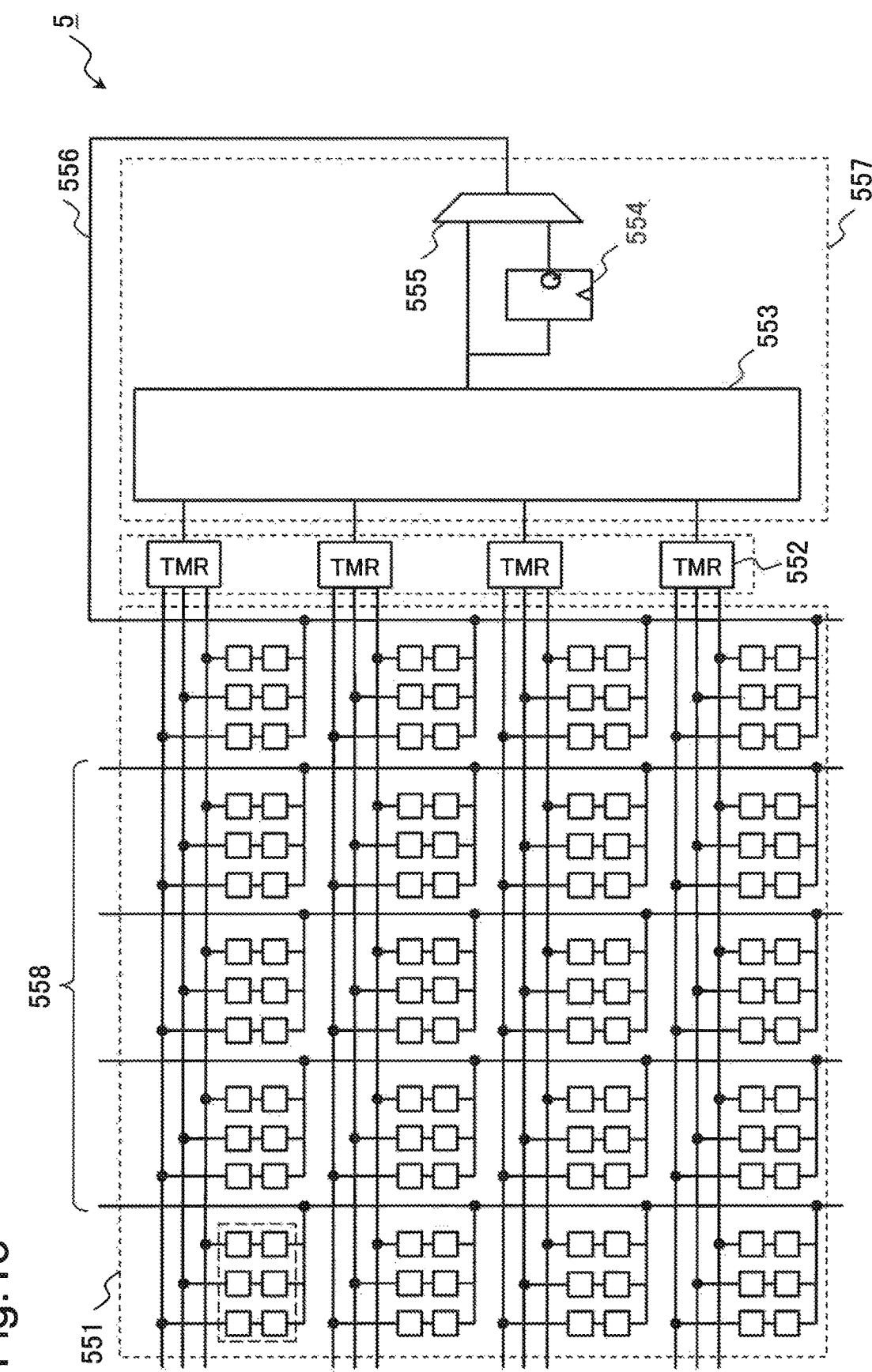
FIG. 13 is a conceptual diagram illustrating a configuration of a reconfiguration logical circuit according to the fifth example embodiment of the present invention.
Figure 14:
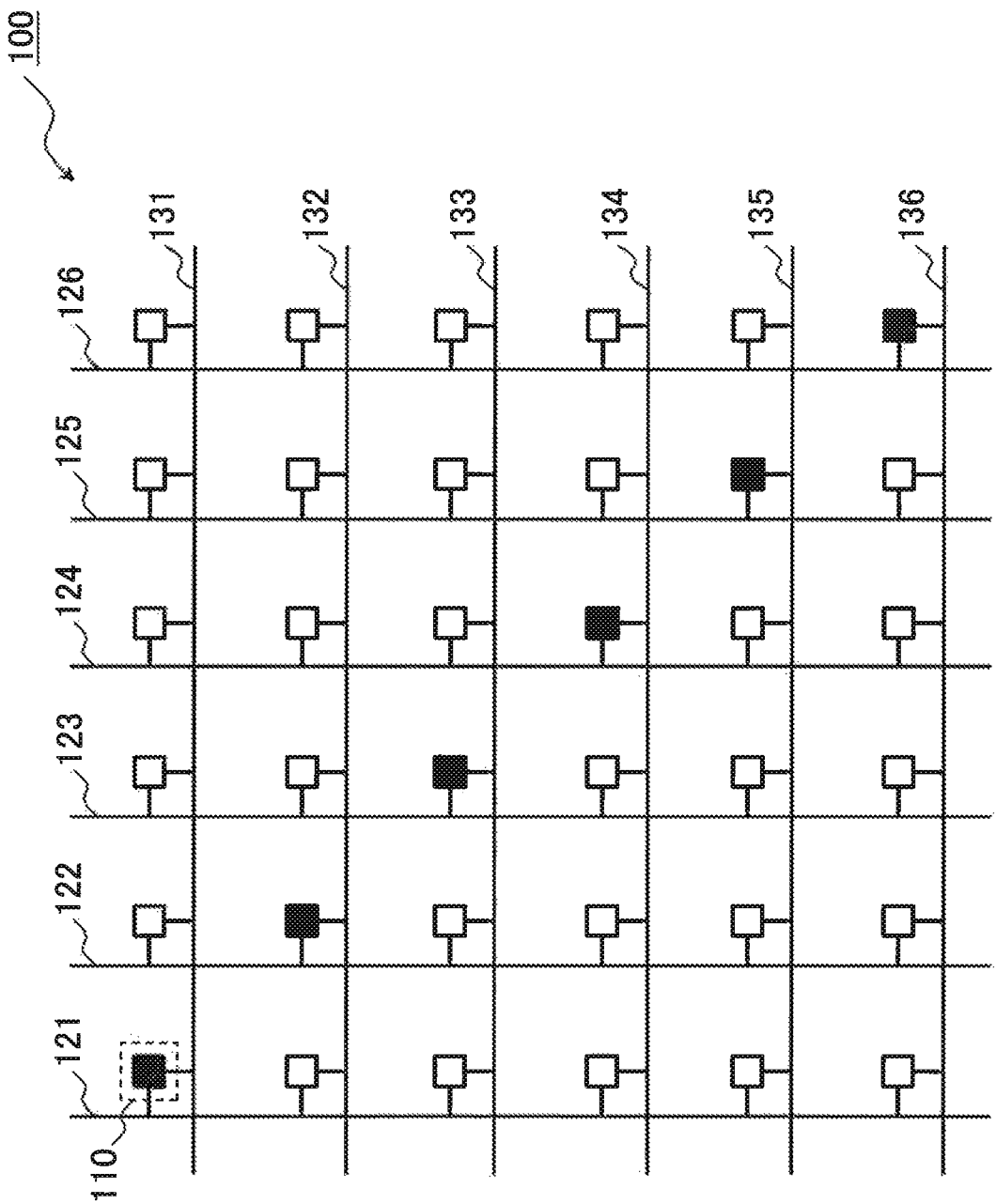
FIG. 14 is a conceptual diagram of an operation state of a crossbar circuit configured with a variable resistance element of PTL 1.
Figure 15:
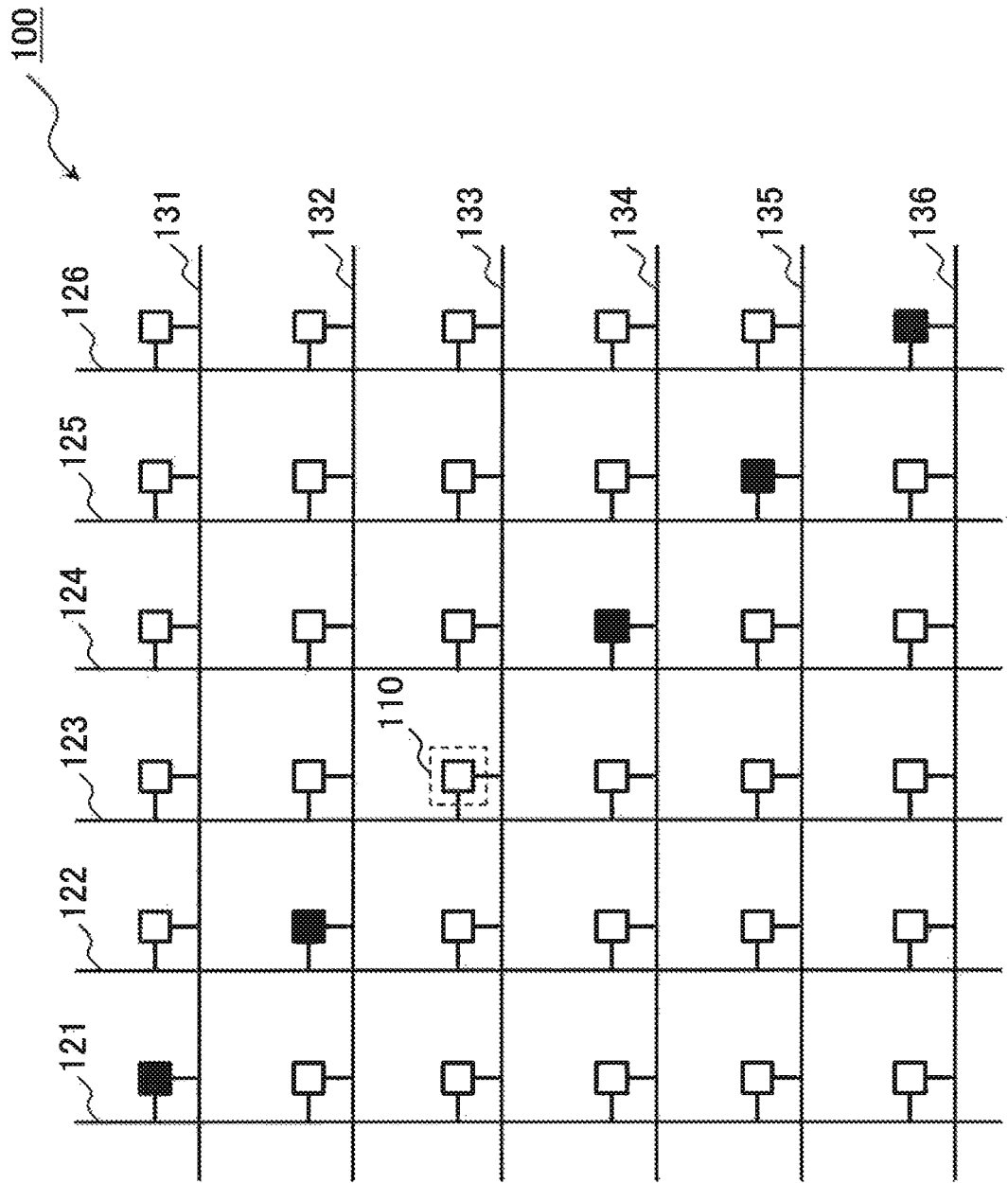
FIG. 15 is a conceptual diagram of an example in which an open failure has occurred to a crossbar circuit configured with a variable resistance element of PTL 1.
Figure 16:
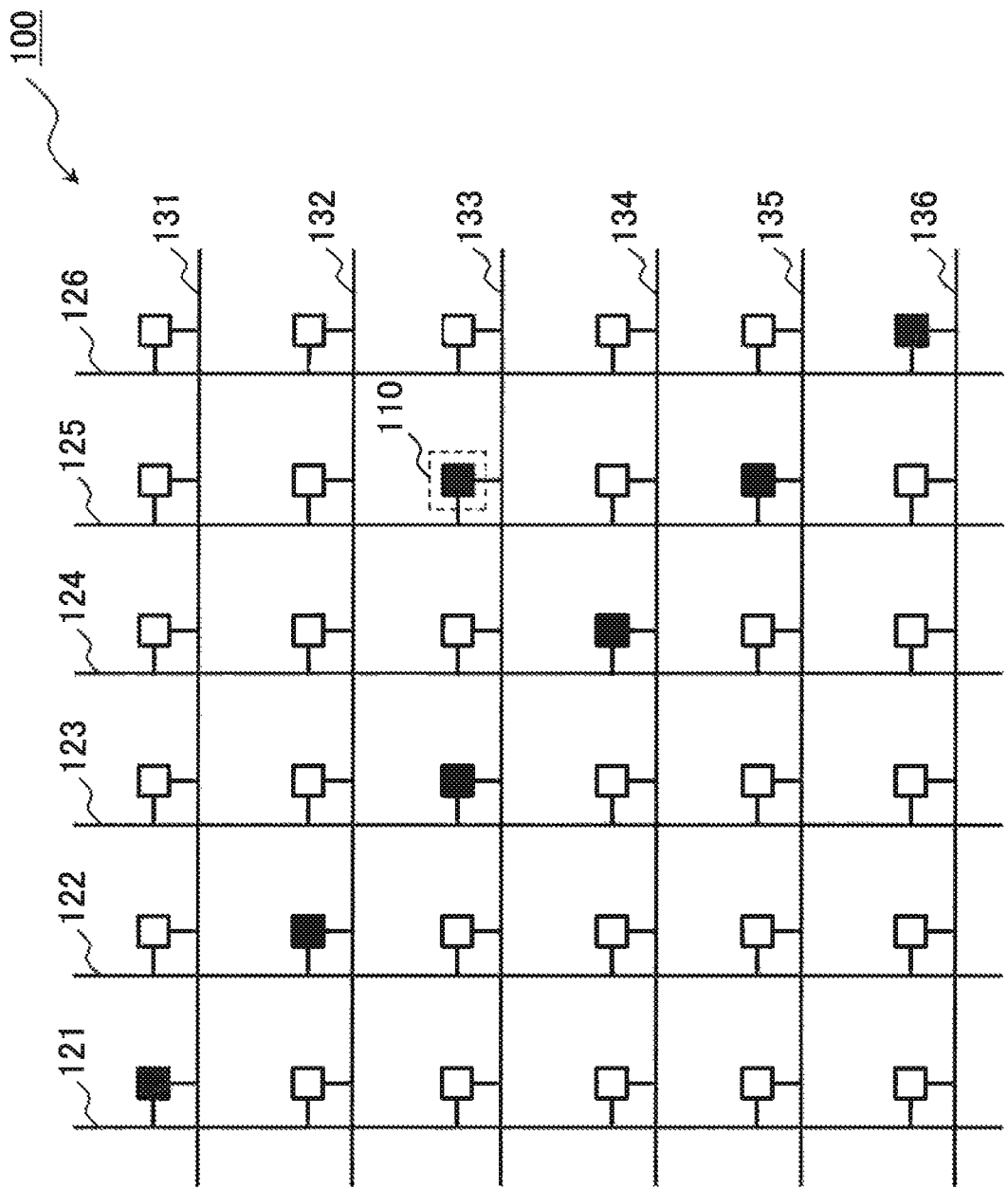
FIG. 16 is a conceptual diagram of an example in which a short circuit has occurred to a crossbar circuit configured with a variable resistance element of PTL 1.
Figure 17:
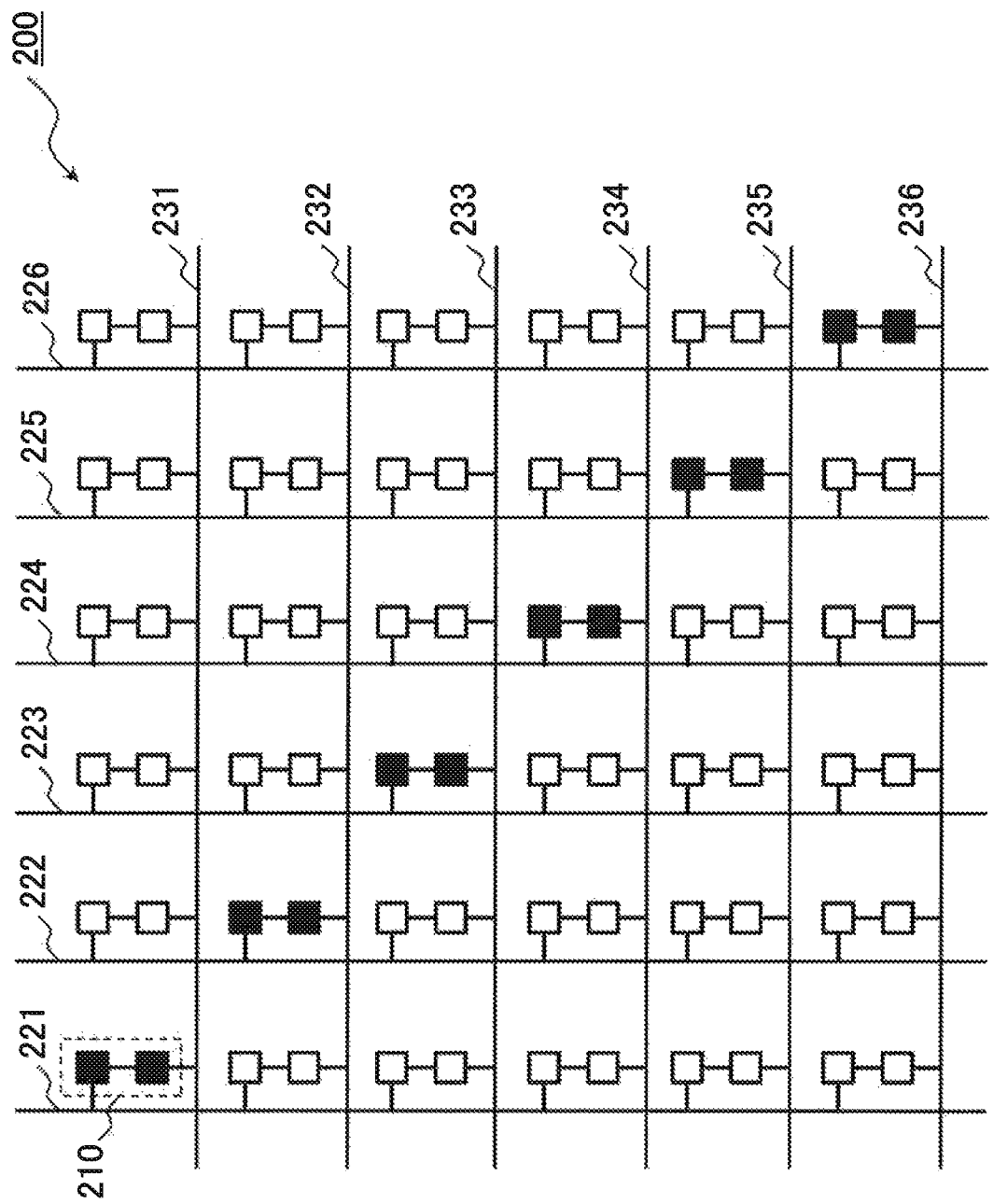
FIG. 17 is a conceptual diagram of an operation state of a crossbar circuit configured with a variable resistance element of PTL 2.
Figure 18:
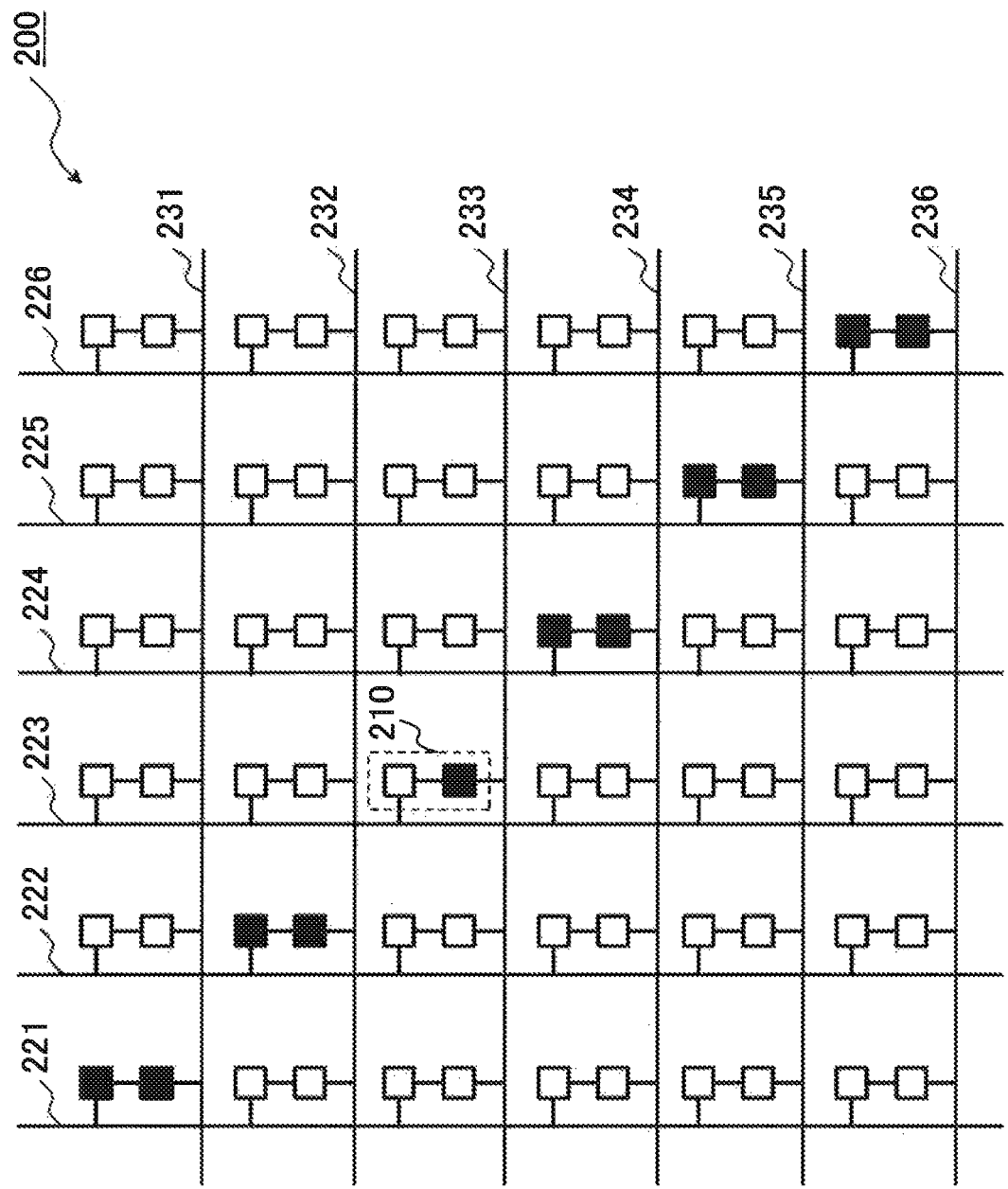
FIG. 18 is a conceptual diagram of an example in which an open failure has occurred to a crossbar circuit configured with a variable resistance element of PTL 2.
Figure 19:
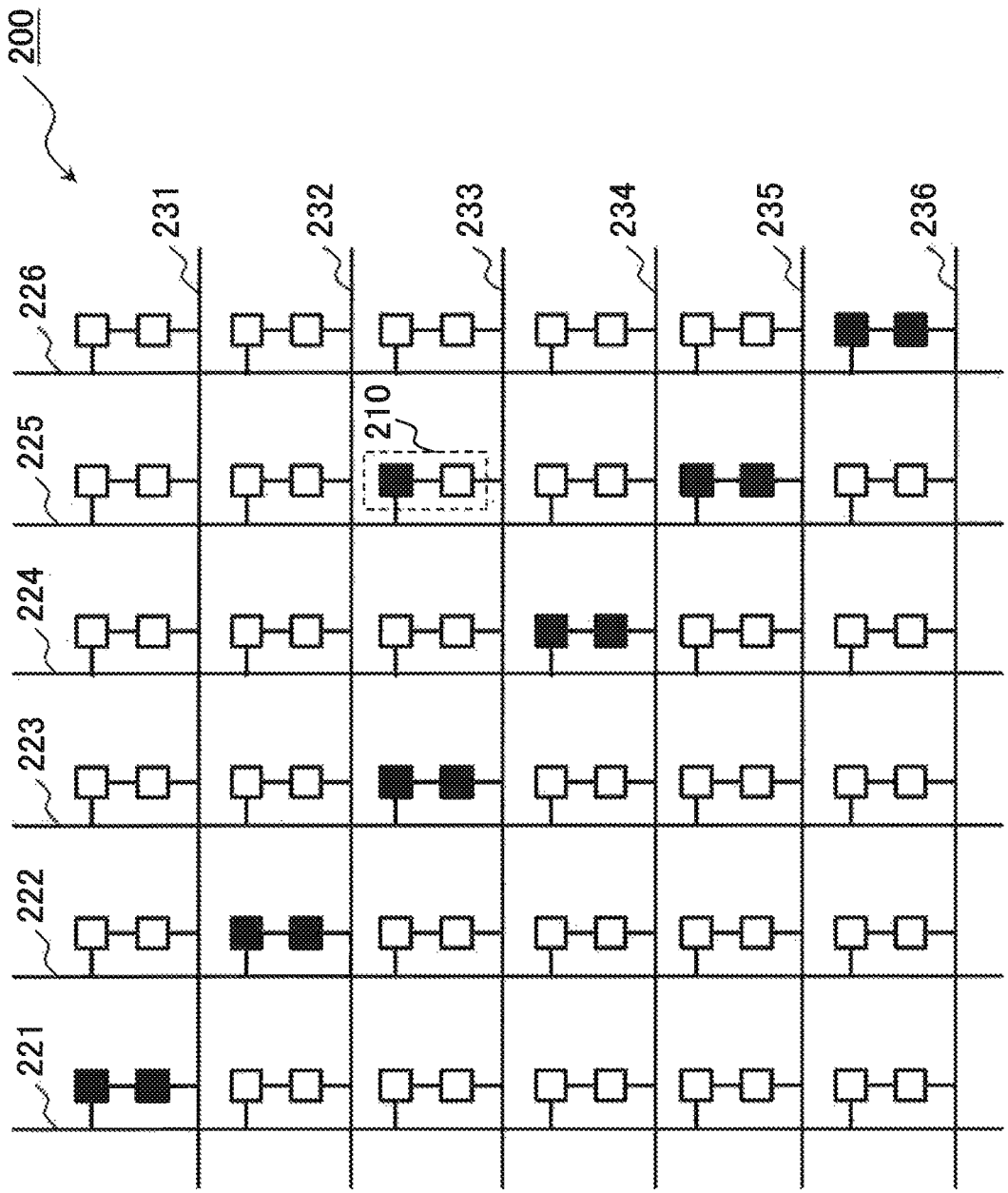
FIG. 19 is a conceptual diagram of an example in which a short circuit has occurred to a crossbar circuit configured with a variable resistance element of PTL 2.

As illustrated in FIG. 13, the reconfiguration logical circuit 5 includes a crossbar circuit 551, a TMR circuit 552, a lookup table circuit 553, a flip flop 554 and a selector 555. The lookup table circuit 553, the flip flop 554 and the selector 555 form a logic block 557. The crossbar circuit 551 includes an input 558, and using the crossbar circuit 551, an arbitrary input is connected to the lookup table circuit 553.

Here, in the crossbar circuit 551 of FIG. 13, various elements of the crossbar circuit described in each example embodiment that are necessary for programming are omitted. The connection function of the crossbar circuit 551 is achieved by turning on/off the unit element to which a variable resistance element is serially connected.

When operating as a crossbar circuit 551, the TMR circuit 552 is put into a conductive state. In addition, as a suitable example, the output 556 of the logic block 557 is fed back to the lookup table circuit 553 via the crossbar circuit 551.

According to the example embodiment, by expanding the circuit illustrated in FIG. 13, and by linking a large number of circuits, a function as a reconfiguration circuit in a larger scale can be provided.

The semiconductor device of each example embodiment can be applied not only to a crossbar circuit but also to a semiconductor device including a memory circuit, a semiconductor device including a logical circuit, or a wiring of a board or a package equipped with the circuits or devices. Examples of a semiconductor device including a memory circuit include a dynamic random access memory (DRAM) and a static random access memory (SRAM). Examples of a semiconductor device including a memory circuit include a ferroelectric random access memory (FeRAM) and a magnetic random access memory (MRAM). Examples of a semiconductor device including a memory circuit include a flash memory and a bipolar transistor. A microprocessor can be given as a semiconductor device including a logical circuit. The method of each example embodiment of the present invention may be applied to a wiring of a board or a package equipped with the above-described circuit or the semiconductor device.

The unit element of the present invention can be applied to an electronic circuit device and an optical circuit device used for a semiconductor device, and a switching device such as a micro electro mechanical systems (MEMS).

The present invention has been described above with the example embodiments, however, the present invention is not limited to the above-described embodiments. Within the scope of the present invention, the present invention may be applied with various changes that may be understood by a person skilled in the art.

REFERENCE SIGNS LIST 1, 2, 3 Semiconductor device
4 Reconfiguration logical circuit
10 Unit element group
11 First unit element
12 Second unit element
15, 16, 17 Intermediate node
18, 19 Terminal
21 First wiring
22 Second wiring
23 Third wiring
30 Intermediate node selection transistor
31 First intermediate node selection transistor
32 Second intermediate node selection transistor
33 Intermediate node program line
34 Intermediate node common selection transistor
35 First selection transistor
36 Second selection transistor
37 Third selection transistor
41 First programming driver
42 Second programming driver
45 Intermediate node programming driver
51 First decode signal line
52 Second decode signal line
53 Third decode signal line
60 Pass transistor
400 Programming driver
401 Constant current transistor
402 Output voltage selection transistor
403 Output transistor
404 Current control terminal
405 Output voltage selection terminal
406 Enable terminal
501 Crossbar circuit
502 Pass transistor
503 Lookup table circuit
504 Flip flop
505 Selector
507 Logic block

The invention claimed is:

1. A semiconductor device comprising:
a first wiring being extended to a first direction;
a second wiring being extended to a second direction that crosses the first direction;
a unit element group having a configuration in which at least two unit elements are arranged in parallel, the unit element including at least two variable-resistance two-terminal elements being connected in series, the unit element group being connected to the first wiring and the second wiring;

a first programming driver that changes a resistive state of the two-terminal element constituting the unit element group via the first wiring;
a first selection transistor in which one terminal of a source terminal and a drain terminal is connected to the first wiring, and another terminal is connected to the first programming driver;
a second programming driver that changes a resistive state of the two-terminal element constituting the unit element group via the second wiring;
a second selection transistor in which one terminal of a source terminal and a drain terminal is connected to the second wiring, and another terminal is connected to the second programming driver;
an intermediate node program line being extended to the second direction, and connected to an intermediate node between the two-terminal elements constituting the unit element via at least one transistor; and
an intermediate node programming driver that changes a resistive state of the two-terminal element constituting the unit element group via the intermediate node program line.

2. The semiconductor device according to claim 1, further comprising:
an intermediate node selection transistor being arranged for each of the unit element groups, in which one terminal of a source terminal and a drain terminal is connected to the intermediate node, and another terminal is connected to the intermediate node program line;
an intermediate node common selection transistor in which one terminal of a source terminal and a drain terminal is connected to the intermediate node program line;
a first decode signal line being commonly connected to a gate terminal of the intermediate node selection transistor and a gate terminal of the first selection transistor; and
a second decode signal line being commonly connected to a gate terminal of the intermediate node common selection transistor and a gate terminal of the second selection transistor, wherein
the intermediate node programming driver is connected to another terminal of a source terminal and a drain terminal of the intermediate node common selection transistor.

3. The semiconductor device according to claim 2, wherein:
a plurality of at least one groups of a group including the first wiring, the first selection transistor, and the first decode signal line, and a group including the second wiring, the second selection transistor, the second decode signal line, the intermediate node program line, and the intermediate node common selection transistor are arranged; and
a group including the intermediate node selection transistor and the unit element group is arranged at one or more intersection points of the first wiring and the second wiring.

4. The semiconductor device according to claim 3, wherein the intermediate node selection transistor is arranged for each of the unit elements constituting the unit element group.

5. A semiconductor device comprising:
a first wiring being extended to a first direction;
a second wiring being extended to a second direction that crosses the first direction;
a unit element group having a configuration in which at least two unit elements are arranged in parallel, the unit element including at least two variable-resistance two-terminal elements being connected in series, the unit element group being connected to the first wiring and the second wiring;
a first programming driver that changes a resistive state of the two-terminal element constituting the unit element group via the first wiring;
a first selection transistor in which one terminal of a source terminal and a drain terminal is connected to the first wiring, and another terminal is connected to the first programming driver;
a second programming driver that changes a resistive state of the two-terminal element constituting the unit element group via the second wiring;
a second selection transistor in which one terminal of a source terminal and a drain terminal is connected to the second wiring, and another terminal is connected to the second programming driver;
a third wiring being paired with the first wiring and extended to the first direction; and
a third selection transistor in which one terminal of a source terminal and a drain terminal is connected to the third wiring, and another terminal is connected to the first programming driver, wherein
the unit element included in the unit element group includes a first unit element being connected to the first wiring and the second wiring, and a second unit element being connected to the first wiring and the third wiring.

6. The semiconductor device according to claim 5, further comprising:
an intermediate node program line being extended to the second direction;
a first intermediate node selection transistor being arranged in such a way as to be associated with the first unit element, in which one terminal of a source terminal and a drain terminal is connected to an intermediate node between the two-terminal elements constituting the first unit element, and another terminal is connected to the intermediate node program line;
a second intermediate node selection transistor being arranged in such a way as to be associated with the second unit element, in which one terminal of a source terminal and a drain terminal is connected to the intermediate node between the two-terminal elements constituting the second unit element, and another terminal is connected to the intermediate node program line;
an intermediate node common selection transistor in which one terminal of a source terminal and a drain terminal is connected to the intermediate node program line; a first decode signal line being commonly connected to a gate terminal of the first intermediate node selection transistor and a gate terminal of the first selection transistor;
a second decode signal line being commonly connected to a gate terminal of the intermediate node common selection transistor and a gate terminal of the second selection transistor;
a third decode signal line being commonly connected to a gate terminal of the second intermediate node selection transistor and a gate terminal of the third selection transistor; and an intermediate node programming driver being connected to another terminal of a source terminal and a drain terminal of the intermediate node common selection transistor.

7. The semiconductor device according to claim 6, wherein a plurality of at least one groups of a group including the first wiring, the first selection transistor, the first decode signal line, the third wiring, the third selection transistor, and the third decode signal line, and a group including the second wiring, the second selection transistor, the intermediate node program line, the second decode signal line, and the intermediate node common selection transistor, are arranged, and a group including the first intermediate node selection transistor, the second intermediate node selection transistor, and the unit element is arranged at one or more intersection points of at least one of the first wiring and the third wiring, and the second wiring.

8. The semiconductor device according to claim 5, further comprising:

a pass transistor connecting the first wiring and the third wiring that are forming a pair, wherein the pass transistor is in a conductive state when no programming is performed, and the first wiring and the third wiring forming a pair have same electric potential.

9. The semiconductor device according to claim 5, further comprising:

a lookup table circuit to which an output of a crossbar circuit including the first wiring, the second wiring, the third wiring, and the unit element group is input;

a flip flop to which an output of the lookup table circuit is input; and a selector to which an output of the lookup table circuit and an output of the flip flop are input, wherein an output of the selector is returned to the lookup table circuit via the crossbar circuit.

10. A programming method for performing programming on a crossbar circuit including a first wiring being extended to a first direction, a second wiring being extended to a second direction that crosses the first direction, a third wiring being paired with the first wiring and extended to the first direction, and at least two unit element groups in which at least two unit elements are arranged in parallel, the unit element including at least two variable-resistance two-terminal elements being connected in series via an intermediate node, the unit element group being arranged between the first wiring and the second wiring and between the third wiring and the second wiring, by changing a resistive state of the two-terminal element of the unit element being a target of programming by applying a voltage that exceeds a reference value between at least one of the first wiring, the second wiring, and the third wiring, and the intermediate node.

* * * * *